United States Patent [19]

Berlincourt

[11] 4,051,396
[45] Sept. 27, 1977

[54] ENCAPSULATION TO PREVENT FRACTURE OF PIEZOELECTRIC HIGH VOLTAGE MECHANISM

[75] Inventor: Don A. Berlincourt, Russell Township, Ohio

[73] Assignee: Channel Products, Inc., Chagrin Falls, Ohio

[21] Appl. No.: 533,646

[22] Filed: Dec. 17, 1974

Related U.S. Application Data

[63] Continuation-in-part of Ser. No. 446,627, Feb. 28, 1974, abandoned.

[51] Int. Cl.² ............................................. H01L 41/08
[52] U.S. Cl. ...................................... 310/340; 310/328
[58] Field of Search ................. 310/8.3, 8.7, 9.1, 9.4, 310/8.9; 319/DIG. 11

[56] References Cited

U.S. PATENT DOCUMENTS

| 2,101,893 | 12/1937 | Bokovoy et al. | 310/9.7 |
| 2,313,129 | 3/1943 | Dohan | 310/9.1 X |
| 2,571,899 | 10/1951 | Kroft et al. | 310/8.7 |
| 2,587,304 | 2/1952 | Fiske, Jr. et al. | 310/8.7 X |
| 2,728,869 | 12/1955 | Pohlman | 310/8.1 X |
| 3,377,439 | 4/1968 | Rouy | 310/8.5 X |
| 3,396,285 | 8/1968 | Minchenko | 310/8.7 |
| 3,466,473 | 9/1969 | Rhoten | 310/8.7 |

*Primary Examiner*—Mark O. Budd

[57] ABSTRACT

New and improved high voltage piezoelectric mechanisms are provided wherein the piezoelectric element is essentially coated or encapsulated in an insulating material which is sticky to the touch and relatively viscous. Useful materials include unhardened adhesive resins. Marked improvement in operating life and high temperature operation are obtained, and piezoelectric ceramic elements need not have load surfaces so flat that lapping is necessary.

10 Claims, 5 Drawing Figures

ENCAPSULATION TO PREVENT FRACTURE OF PIEZOELECTRIC HIGH VOLTAGE MECHANISM

This application is a continuation-in-part of Application Ser. No. 446,627 filed Feb. 28, 1974, and now abandoned.

This invention relates generally to piezoelectric high voltage sources and more particularly to piezoelectric high voltage mechanisms in which the piezoelectric element is essentially struck or squeezed. This invention involves an improved method of coating or encapsulation of the piezoelectric element which provides operational and economic advantages.

BACKGROUND OF THE INVENTION

Piezoelectric high voltage devices of both the impact type and gradual squeeze type are known in the prior art. There are various means of assembling or mounting the piezoelectric element or elements. In some cases, thin soft metal wafers are placed between each end of each piezoelectric element and the associated metallic adjacent end means. These adjacent end means are often identified as impact pin and anvil means. In other cases the piezoelectric elements and associated impact and anvil means are molded in a plastic body.

In some cases the piezoelectric elements and impact pin and anvil means are held loosely in an insulating body and encapsulated in epoxy or other relatively hard insulating material. Various materials have been used in connection with piezoelectric elements, including silicone oil, silicone grease, and rubber. These materials have been utilized to create a damping effect.

A persistent problem which has existed in the art associated with the use of piezoelectric ignition devices has been the operating life, especially over a wide temperature range, of such devices. There is a need for piezoelectric high voltage devices which survive a greater number of ignitions than have heretofore been available. The present invention addresses this problem and provides a piezoelectric high voltage mechanism which enjoys a vastly superior operating life than devices previously used.

It is therefore a primary object of the present invention to provide a new and improved high voltage piezoelectric mechanism that alleviates the aforementioned difficulties in the art. It is a further object of this invention to provide such a new and improved high voltage piezoelectric mechanism which is constructed in a relatively simple and efficient manner. Another object of the invention is to provide a high voltage piezoelectric mechanism which has a long and reliable operating life. Yet another object of this invention is to provide a high voltage piezoelectric mechanism which has superior operating characteristics over a wide temperature range.

It is also an object of this invention to provide an encapsulation for high voltage piezoelectric mechanism which assures long and reliable operating life. It is a further object to provide by this means superior operating characteristics over a wide temperature range. Another object of this invention is to provide an encapsulation for high voltage piezoelectric mechanisms which allows use of piezoelectric elements without nearly perfect plane and parallel load surfaces. A further object of this invention is to provide an encapsulation for high voltage piezoelectric mechanisms which prevents dielectric breakdown or leakage across the surface of the piezoelectric element or between the internal electrodes of the high voltage mechanism.

Other objects, uses, advantages and novel features of this invention will be set forth in part in the description which follows and in part will be obvious from the description or may be learned by practice of the invention. The objects and advantages of the invention may be realized and attained by means of the instrumentalities, combinations and materials particularly pointed out in the appended claims.

SUMMARY OF THE INVENTION

To achieve the foregoing objects and in accordance with the purpose of the invention as embodied and broadly described herein, the piezoelectric element is held between metallic adjacent end means at each end within an insulating body with the space between the piezoelectric element and insulating body essentially filled with a fairly viscid or viscous sticky coating. The coating also fills the space created by imperfect mating between the end surfaces of the piezoelectric element or elements and the associated metallic parts. This encapsulation method provides longer operating life, superior operating characteristics over a wide temperature range and economic advantages.

In accordance with this invention, there is therefore provided piezoelectric element means. As embodied herein, the piezoelectric element means may be any conventional piezoelectric element effective to provide an electric spark source in response to actuation thereof. A ceramic piezoelectric element, as is known in the art, is suitable for use in the practice of the present invention.

The piezoelectric element means may be coated or essentially encapsulated on lateral surfaces in a tacky or sticky insulating material. Preferably, the insulating material is relatively viscous, but the important property which has been found unexpectedly to result in the vastly improved results achieved by the present invention is that of the tackiness or stickiness of the material. It is sufficient that the insulating material be reasonably tacky or sticky to the touch, and uncured and unfilled resinous adhesives have been found to be suitable materials. Preferably, the insulating material is an uncured and unfilled epoxy resin.

The piezoelectric mechanism according to the present invention may be either of the gradual squeeze type or the impact type. Preferably, the devices of this invention are piezoelectric mechanisms of the impact type.

BRIEF DESCRIPTION OF THE DRAWINGS

The invention consists in the novel parts, constructions, arrangements, combinations, materials, methods, and improvements shown and described. The accompanying drawings which are incorporated in and constitute a part of this specification illustrate prior art devices and preferred embodiments of the present invention, and together with the description of the invention serve to explain the principles of the invention.

DETAILED DESCRIPTION OF THE INVENTION

Figure 1:
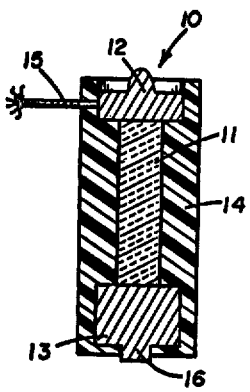
FIG. 1 is a schematic cross-sectional view of a piezoelectric assembly in prior art devices.

With reference to FIG. 1, a prior art device 10 includes insulating body means 14. The device 10 may be used in an impact high voltage piezoelectric mechanism such as that described in U.S. Pat. No. 3,200,295 (Owens) or in a squeeze type high voltage piezoelectric mechanism such as that described generally in U.S. Pat. No. 3,082,333 (Hufferd). It can also form part of a high voltage piezoelectric mechanism in which insulating body means 14 of insulating material is extended and contains means for providing the force on the metallic adjacent end means 12, sometimes identified as impact pin means. In the device 10 the piezoelectric element means 11 is disposed between metallic adjacent end means 13, sometimes identified as anvil means, and impact pin means 12. The high voltage generated when the impact pin means is struck is delivered by wire connection means 15 and the tip 16 of anvil means 13. The impact pin 12, anvil 13 and piezoelectric element 11 are molded or cast in the insulating body 14.

The assembly shown in FIG. 1 has three major disadvantages. First, the piezoelectric element 11 must have flat and smooth surfaces, such as lapped surfaces, where the piezoelectric element contacts the impact pin 12 or anvil 13. Otherwise, premature cracking of the element is likely to occur. This is especially true if insulating case 14 does not bond tightly to the piezoelectric element. Second, if the insulating case does bond tightly to the piezoelectric element, a significant portion of the mechanical energy applied to the unit is absorbed in the insulating case, reducing work done on the piezoelectric element. Third, an increase in temperature by as little as 50° F causes expansion of the insulating case at a rate so much higher than that of the piezoelectric element that mechanical contact between the impact pin 12 and the piezoelectric element and between the anvil 13 and the piezoelectric element is broken. An impact delivered to the impact pin is in this case virtually entirely absorbed in the insulating case and the unit is inoperative.

Figure 2:
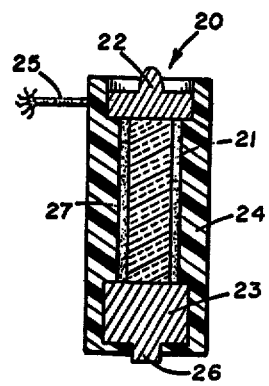
FIG. 2 is a schematic cross-sectional view of another piezoelectric assembly in prior art devices.

In FIG. 2 a cross-sectional view of another prior art device 20 is shown. Here piezoelectric element means 21 is disposed between impact pin means 22 and anvil means 23 in insulating case means 24. Connection means are wire means 25 and tip means 26 of anvil means 23. The space between piezoelectric element means 21 and insulating case means 24 is essentially filled with hard insulating cement means 27 such as epoxy resin. This encapsulation means may eliminate or at least reduce breakage of piezoelectric element 21 even though piezoelectric element means does not have lapped or very smooth surfaces, since in such case a small amount of the cement may be forced into spaces between impact pin 22 and piezoelectric element 21 and between anvil 23 and piezoelectric element 21. However, high temperature failure will usually occur at a temperature about 50° F above the temperature at which the cement 27 is cured, since the cement softens. If a high temperature cure is used, then thermal expansion of the insulating case, which is much higher than that of the piezoelectric element, will cause a considerable portion of the cement 27 to be drawn between impact pin 22 and piezoelectric element 21 and between anvil 23 and piezoelectric element 21. This cement remains as the unit 20 is cooled. Subsequently, it acts to reduce electric output drastically because the cement insulates the element from the electrical connections. Furthermore, since the cement 27 is generally softer than the piezoelectric element 21 a portion of the mechanical energy is absorbed and not transmitted to the piezoelectric element 21. Note that use of a high temperature cure with a compressive bias force applied between anvil 23 and impact pin 22 will eliminate this problem. This is, however, not economically feasible.

Figure 3:
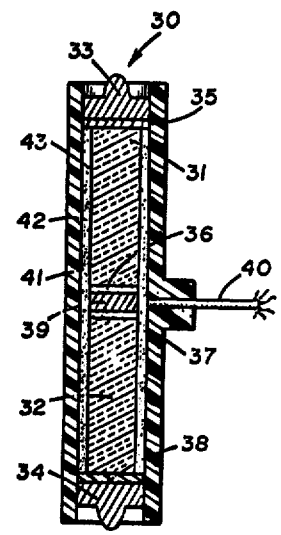
FIG. 3 is a schematic cross-sectional view of yet another piezoelectric assembly in prior art devices.

FIG. 3 shows still another prior art device 30. Here piezoelectric element means consisting of two elements 31 and 32 have soft metallic wafer means 35 and 36, and 37 and 38, on opposite faces of each element. These are generally made of aluminum or copper. Adjacent end means 33 and 34 are disposed on opposite ends of the assembly 30. The body 41 is insulating. Electrical connection is by wire means 40 connected to metallic spacer means 39 and metallic frame means into which the assembly 30 is inserted. This provides a connection between adjacent end means 33 and 34. In the case of the impact type high voltage piezoelectric mechanism, if the blow is imparted to adjacent end means 33, then an anvil means within the metallic frame means abuts adjacent end means 34. In some prior art devices the assembly 30 contains some relatively light oil 43 partly filling the space 42. This assembly scheme avoids loss of mechanical energy in the insulating body 41 and the soft metal wafers 35, 36, 37, 38 reduce the requirement for flat and smooth surfaces on the piezoelectric elements 31 and 32. Furthermore, even though the insulating body 41 expands with temperature increase at a rate faster than the piezoelectric element, thus causing the assembly to loosen, the first blow to adjacent end means 33 will force the assembly again into good contact and subsequent blows are then fully effective. In comparison with the encapsulation means of this invention, however, the assembly means 30 of FIG. 3 has much higher failure rates due to cracking of the piezoelectric element means where piezoelectric element means consist of unlapped as-fried piezoelectric ceramic elements.

Figure 4:
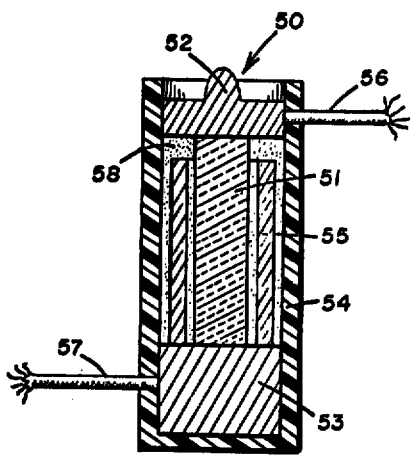
FIG. 4 is a schematic cross-sectional view of a piezoelectric device constructed in accordance with this invention.

FIG. 4 illustrates one form for the device 50 of this invention. Piezoelectric element means 51 is disposed between metallic impact pin means 52 and anvil means 53 within insulating body means 54. Electrical connection means 56 and 57 are connected to impact pin means 52 and anvil means 53 respectively. Bushing means 55 of insulating material acts to center piezoelectric element means 51 within body means 54. Encapsulation means 58 essentially fills the space between body means 54, piezoelectric element means 51 and bushing means 55. Bushing means may be eliminated by some obvious changes in mechanical design of the assembly 50.

The encapsulation means consists of an insulating viscid or glutinous material, that is a material which is thick and sticky like heavy syrup. A material such as epoxy resin without hardener is satisfactory. It is generally best if unfilled, but many filled resins are also satisfactory.

The important property which has been unexpectedly found to lead to the greatly improved results attained by the present invention is the tackiness or stickiness of the insulating material. The material should be relatively viscous in addition to being tacky or sticky to the touch. Suitable materials for use in accordance with this invention include adhesives which are unhardened. For example, resinous materials such as epoxy resins without hardener may be used. One particular material which has been found to be effective is sold under the trademark "Eccobond 55" by Emerson & Cummings, Inc., Canton, Massachusetts. "Eccobond 55" is characterized as a low-viscosity epoxy adhesive for general industrial use. As used in the present invention, "Eccobond 55" or other insulating material is employed without the addition of catalyst which would effect undesirable hardening for purposes of the invention.

The very well adhering or sticky material acts to prevent internal leakage or dielectric breakdown across the surface of piezoelectric element means 51 and between anvil means 53 and impact pin means 52. This encapsulation means 58 also acts to damp mechanically the assembly and thus prevent spalling or fracture of piezoelectric element means 51. Encapsulation means 58 also is forced by operation or during assembly into any small crevasses or cracks which exist between piezoelectric element means 51 and impact pin means 52 and between piezoelectric element means 51 and anvil means 53 due to unlapped or nonsmooth surfaces of piezoelectric element means. This has been found virtually to eliminate fracture of piezoelectric element means 51 in extended operation.

With increasing temperature, body means 54 expands at a rate greater than that for piezoelectric element means 51, pulling encapsulation means 58 between impact pin means 52 and piezoelectric element means 51 and between anvil means 53 and piezoelectric element means 51. The first actuation of the mechanism then forces the assembly back to good contact and subsequent actuations to pin means 52 are then fully effective. Temperature decrease does not cause deleterious effects, although at low temperatures the viscosity of encapsulation means 58 is usually increased considerably.

Figure 5:
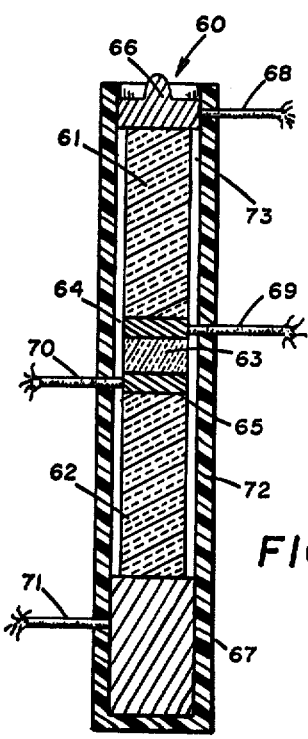
FIG. 5 is a schematic cross-sectional view of another embodiment of a piezoelectric device constructed in accordance with this invention.

FIG. 5 shows another assembly for a high voltage piezoelectric mechanism according to this invention identified by the number 60. Piezoelectric element means consisting of piezoelectric elements 61 and 62 is disposed between anvil means 67 and impact pin means 66 within insulating case means 72. Metallic connection means 64 is disposed between piezoelectric element 61 and insulator means 63 and metallic connection means 65 is disposed between piezoelectric element 62 and insulator means 63. Electrical connections are made by wire means 68 to impact pin 66, wire means 69 to metallic means 64, wire means 70 to metallic means 65 and wire means 71 to anvil 67. Encapsulation means 73 essentially fills the remaining space within insulating body means 72. Encapsulation means 73 consists of an insulating viscid or glutinous material as described above. The high dielectric strength and low leakage of the encapsulation means 73 prevents breakdown between metallic members 64 and 65 even though insulation means 63 has considerably less axial length than piezoelectric elements 61 and 62. This allows shorter length for the subassembly 60 and, furthermore, allows small mechanical energy storage in insulator means 63, which would otherwise significantly reduce electric energy output from piezoelectric element 62.

EXAMPLE

In a test of the assembly and encapuslation means of this invention relative to that illustrated in FIG. 3, a group of unlapped piezoelectric ceramic elements was selected. Many elements contained edge chips and rough surfaces. They were divided at random into three groups. Ten piezoelectric impact type piezoelectric mechanisms, identified as Group 1, were constructed according to the structure in FIG. 4 using a commercial unfilled epoxy resin without hardener for viscid encapsulation means 58. Ten units, Group 2, were built with encapsulation means 58 eliminated, but with one soft aluminum disc 0.005 inches thick placed between impact pin means 52 and piezoelectric element means 51 and another soft aluminum disc 0.005 inches thick placed between anvil means 52 and piezoelectric element means 51. Piezoelectric element means was also soaked in silicone fluid (Dow Corning 200). Another ten units, Group 3, were built identical to Group 2 except two aluminum discs 0.005 inches thick were placed between impact pin means 52 and piezoelectric element means 51 and between anvil means 53 and piezoelectric element means 51. These piezoelectric high voltage mechanisms were then subjected to impacts in the high voltage piezoelectric mechanism at a rate of one per second. They were periodically tested. It was found that only two units from Group 2 and three units from Group 3 survived 15,000 operations. None from either group survived 30,000 operations. All units from Group 1 survived 50,000 operations when the test was terminated. All units from Group 1 suffered less than 15% decrease in energy output. In other tests it was shown that with lapped elements free of edge chipping most, but not all, units assembled as Groups 2 and 3 survived 50,000 operations at one per second.

While there have been described what are at present considered to be the preferred embodiments of this invention, it will be obvious to those skilled in the art that various changes and modifications may be made therein without departing from the invention, and it is aimed, therefore, in the appended claims to cover all such changes and modifications as fall within the true spirit and scope of the invention.

What is claimed is:

1. A high voltage piezoelectric mechanism with piezoelectric element means essentially coated with viscid insulating material.

2. A high voltage piezoelectic mechanism according to claim 1 in which the mechanism is an impact type piezoelectric high voltage mechanism.

3. A high voltage piezoelectric mechanism with piezoelectric element means essentially encapsulated on lateral surfaces in viscid insulating material.

4. A high voltage piezoelectric mechanism according to claim 3 in which the mechanism is an impact type high voltage piezoelectric mechanism 5. A high voltage piezoelectric mechanism comprising:

Piezoelectric element means effective to provide an electrical spark source in response to actuation thereof; insulating body means housing said piezoelectric element means; encapsulation means of insulating material which is tacky to the touch essentially coating said piezoelectric element means.

6. A high voltage piezoelectric mechanism according to claim 5 further comprising metallic adjacent end means abutted to load surfaces of said piezoelectric element means housed in said insulating body means.

7. A high voltage piezoelectric mechanism according to claim 6 in which the mechanism is an impact type high voltage piezoelectric mechanism.

8. A high voltage piezoelectric mechanism according to claim 6 in which said encapsulation means essentially fills any free space between said piezoelectric element means and said insulating body means.

9. An impact type high voltage piezoelectric mechanism comprising:

A ceramic piezoelectric element effective to provide an electrical spark source in response to actuation thereof; metallic adjacent end means abutted to load surfaces of the piezoelectric element; the piezoelectric element encapsulated in a coating of a viscous, sticky insulating material; and insulating body means containing the piezoelectric element, the coating, and the metallic adjacent end means.

10. An impact type high voltage piezoelectric mechanism according to claim 9 in which the viscous, sticky insulating material is an unhardened epoxy resin.

* * * * *